United States Patent [19]

Holzer

[11] Patent Number: 4,660,172
[45] Date of Patent: Apr. 21, 1987

[54] STORAGE MEDIUM FOR ELECTRONIC DATA PROCESSING

[76] Inventor: Walter Holzer, Drosteweg 21, 7758 Meersburg, Fed. Rep. of Germany

[21] Appl. No.: 554,673

[22] Filed: Nov. 23, 1983

Related U.S. Application Data

[63] Continuation-in-part of Ser. No. 192,020, Sep. 29, 1980, abandoned.

[51] Int. Cl.⁴ .................. G11C 19/08; G11C 17/00
[52] U.S. Cl. .................................... 365/2; 365/45; 365/94
[58] Field of Search ........... 365/1, 2, 94, 97, 100–105, 365/51, 52; 235/380, 382, 492; 360/2

[56] References Cited

U.S. PATENT DOCUMENTS

| | | | |
|---|---|---|---|
| 3,022,381 | 2/1962 | Pferd | 235/492 |
| 3,653,006 | 3/1972 | Kohler | 235/380 |
| 3,883,856 | 5/1975 | Saito et al. | 365/100 |
| 4,001,891 | 1/1977 | Held | 360/132 |
| 4,090,224 | 5/1978 | Sato | 360/132 |
| 4,158,433 | 6/1979 | Peterson et al. | 235/380 |
| 4,237,376 | 12/1980 | Giacomotti et al. | 360/2 |
| 4,287,568 | 9/1981 | Lester | 365/1 |

FOREIGN PATENT DOCUMENTS 0028585  2/1980  Japan ...................... 365/1

OTHER PUBLICATIONS

Electronics Products Magazine—Mar. 1977; pp. 11 & 12.

Primary Examiner—James W. Moffitt
Attorney, Agent, or Firm—Birch, Stewart, Kolasch & Birch

[57] ABSTRACT

A storage medium is disclosed which includes a plate having a plurality of taps arranged near the peripheral edges and on each surface thereof. Each tap is connected to a storage element. The taps are arranged near the peripheral edges of both sides of the plate in order to provide for an increased amount of storage of information in one plate. The plate may have interruptable lead lines between the taps and the storage elements to prevent erasure of information stored in the storage element. The plate is inserted into a holder fitting of a data processor for a cyclic-series read-out or recordation of digital information out of or into the storage elements on the plate. The storage elements located on each surface of the plate are used for storage of information. Labels may be used to identify the digital information stored on each surface of the plate.

12 Claims, 6 Drawing Figures

STORAGE MEDIUM FOR ELECTRONIC DATA PROCESSING

BACKGROUND OF THE INVENTION

This application is a continuation-in-part of application Ser. No. 192,020 filed Sept. 29, 1980 and now abandoned.

Modern data processing utilizes various forms of storage media (data recording media). Among these are the fixed, installed storage units employed in computer installations, as well as external storage media in the form of magnetic tapes, disk storage units, magnetic core storage units, and others. A differentiation is also made between data storage units which can only be read out, and storage units suitable for repeated data input, subsequent interrogation, and optional erasure. All storage media have the requirement in common that they should be capable of being manipulated in an easy and simple way and that they should offer directional access to various data within a minimum period of time.

Recent developments have tended to increasingly favor fixed storage units, i.e. storage units wherein the data can be read out without moving the storage medium. This type of data storage quite obviously exhibits the advantage that there is no need for mechanically moving drive mechanisms or components. Small computers as well as relatively large computer installations, already possess such storage units with internal storage capacities that will doubtlessly be even further exploitable with continued developments in VLSP (Very Large Scale Integration) technology.

SUMMARY OF THE INVENTION

It is, therefore, an object of the present invention to provide a storage medium for electronic data processors for recording and reproducing digitally, stored language and music, this storage medium being inserted in a fitting holder, wherein a certain directive is already given to the storage medium by the manner in which it is inserted into the holder. These and other objects of the present invention will become more fully apparent with reference to the following specification and drawings which relate to preferred embodiments of the invention, but not intended to be limitative thereof.

In accordance with the present invention a storage medium in the shape of a square plate is provided such that by associating the edges of the square, with taps for the data to be stored, or which is already in storage, depending on which edge of the storage medium is inserted into a holder fitting of a data processor, the recording or read-out of the information begins from the storage unit corresponding to the respective edge. The construction of the storage medium as a square plate permits the association of four storage sections with the four sides of the square. The plate may be flexible and have a relatively small thickness dimension.

In another embodiment of the present invention, taps for the data to be stored or already in storage, are arranged so that, upon insertion of the turned-over plate in the holder, different information is stored or different information is read out of the memory content which corresponds to the respective edges. By this construction of the storage medium, it is thus possible to make a division into eight different storage sections and/or to make such sections available for direct access.

DETAILED DESCRIPTION

Figure 4:
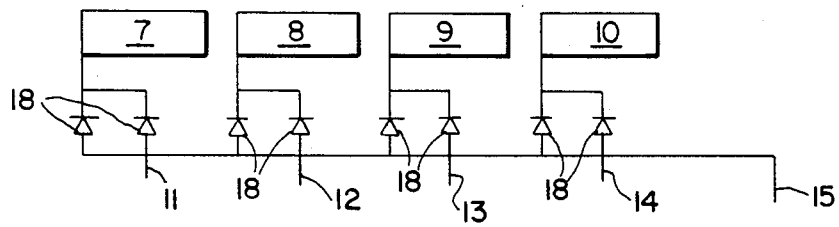
FIG. 4 represents one embodiment of a switching circuit for read-out of the information stored in the memory contents by utilizing the taps on the storage medium of the present invention.

In order to be able to optimally utilize the storage capacity which can be accommodated on the storage medium of the present invention, it is desirable in many cases to have the individual sections, which are associated with the different edges, adjoin one another cyclically as further discussed below (FIG. 4). In this connection, depending on the particular usage, the constructional engineer is free to choose the capacity of the storage units to be of different size. There is yet the possibility preserved of effecting subdivision into various portions with direct access.

In certain cases it may be desirable to be able to select each section individually, but yet to have the possiblity of coupling also the series-joined sections. This would be of interest, for example, if a number of musical selections is involved, which are to be played either individually or as a succession of musical selections. For this purpose, the invention provides that, depending on the edge with which the storage medium is inserted into the holder, the storage section associated with that edge is activated or interrogated without cyclic continuation, and at least one other position is additionally provided wherein, after insertion of the storage medium, the input and/or read-out procedure is cyclically continued.

It is of great importance for practical usage that the storage medium be provided with features so arranged such that, after input of information they prevent the erasure of the information, and which also prevent similar erasure in the case of storage media already provided with information. Such features or devices already exist in tape playing cassettes, wherein electrical and mechanical measures must be differentiated. According to the present invention, it is suggested that, in order to prevent the erasure of information, connecting lines should be arranged, at the storage medium, to be interruptable, for example, by scraping. This measure provides an electrical remedy. A mechanical device is likewise possible. It is suggested according to the present invention that break off parts be provided for breaking off from the storage medium, for example at the edges of the storage media, thus blocking the transmission of erasing currents in the holder. This takes place conventionally, for example, by means of a scanning lever which opens or closes a blocking contact.

A clear labeling or characterization of the data contents is likewise of special significance. According to the present invention, this problem is solved by arranging on the outer rim of the square plate labels or characteristic symbols denoting the associated data content. Of course, care must be taken, as is known, to keep the labeling or characterization clearly recognizable when the storage medium has been inserted in a holder.

Figure 5:
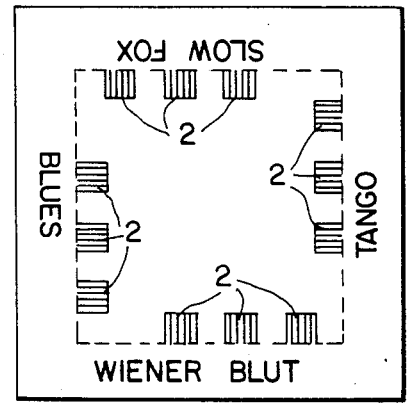
FIG. 5 represents another embodiment of the storage medium of the present invention having the taps arranged on the inner portion of a square plate storage medium and including characterization labels associated therewith.

To protect the taps (especially if electrical contacts are involved) from contamination and damage during use, it is proposed, according to the invention, to arrange these taps in an inner zone of the square area (FIG. 5). Thus the outer rim remains preserved for labeling or characterizing symbols.

According to the invention, provision is further made to transmit additional directives to the device when the storage medium is inserted in the holder. During insertion of the storage medium, a contact means is activated which turns on the entire installation.

Another embodiment of the invention resides in that devices are arranged at the holder which serve to mechanically lock the inserted storage medium into the holder. This is of importance, in particular, if such a storage medium is utilized in a vehicle where strong vibrations can occur.

Figure 1:
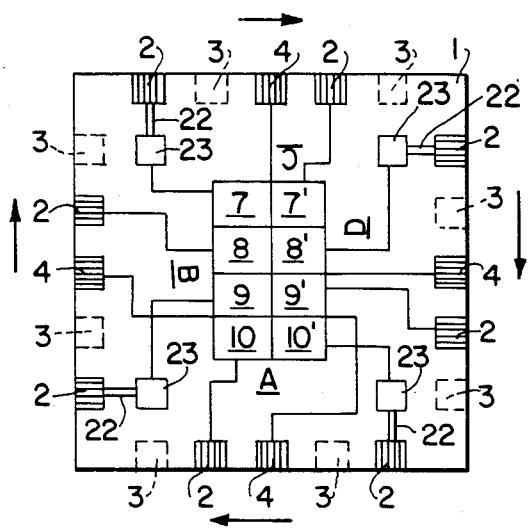
FIG. 1 represents an embodiment of the storage medium of the present invention in the form of a square plate with taps arranged therearound.

Referring now to the illustrations, FIG. 1 shows, by way of example, the construction of a storage medium 1 having at its edges numerous taps 2. Different taps 3 are also provided on the reverse side of the storage medium. The letters "A", "B", "C", "D" are associated, for example, with the four edges of the square as characterizing symbols.

Figure 2:
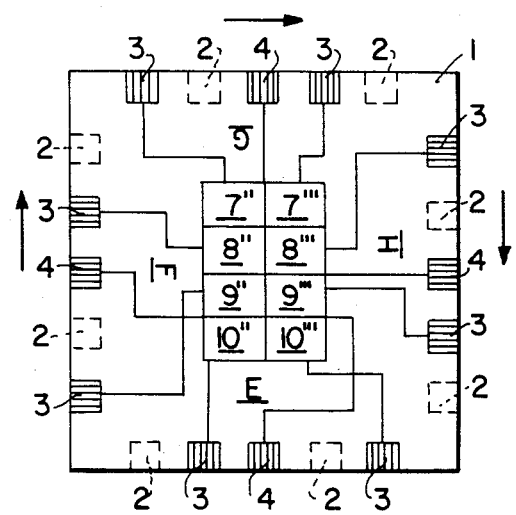
FIG. 2 illustrates the back side of the storage medium of FIG. 1.

FIG. 2 shows the same storage medium 1, this time from the back or reverse side, so that the taps 3 are now located on top and the taps 2 on the bottom. It is, of course, possible to provide, at certain other locations, taps 4 on both sides of the storage medium as illustrated in FIG. 1 and in FIG. 2. The characterization of the edges with the letters "E", "F", "G", and "H" is likewise illustrated in FIG. 2.

FIG. 1 and FIG. 2 show the actual storage elements, for example bubble memories, conventionally arranged on or in the storage media and connected to the taps as indicated in the manner of printed circuit boards. Memory contents are represented as 7, 7', 8, 8', 9, 9', and 10, 10', in FIG. 1. Similarly, memory contents are registered as 7'', 7''', 8'', 8''', 9'', 9''' and 10'', 10'''40 in FIG. 2. The plate 1 is inserted into a holder (FIGS. 3 and 6) in the directions indicated by the arrows.

Figure 3:
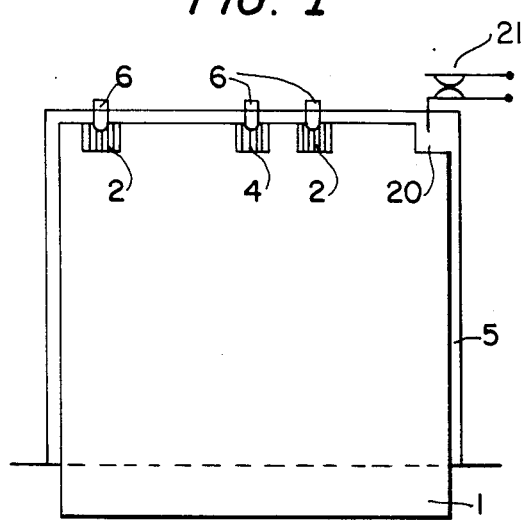
FIG. 3 represents a storage medium used in conjunction with a contact for the prevention of the erasure of information stored on the plate.

FIG. 3 shows schematically a storage medium 1 inserted into a housing 5, wherein the taps 2 and 4 correspond to associated counter contacts 6. The individual read-out of specific storage content and/or the cyclic series connection is generally a electronic switching procedure and is illustrated schematically in FIG. 4. The memory contents 7, 8, 9, and 10 are individually activated, for example, by way of the taps 11, 12, 13, or 14, i.e. upon insertion of the storage medium into the holder. The tap 12 for example, is connected to its counter contact in the holder and the memory content 8 is released for read-out and, after read-out has been accomplished, the process is terminated. The same process takes place in case of the other memory contents 7, 9 and 10. In contrast thereto, if the interrogation procedure is started via the tap 15, then all 4 storage contents 7 thru 10 are released for read-out, and they run cyclically. The decoupling diodes 18 serve to electrically separate the commands. Of course, many known circuit variations are possible in this configuration.

FIG. 1 and FIG. 2 illustrate an exemplary embodiment of the storage medium, as a printed circuit board, with the taps along the edge of the board, wherein the storage elements are arranged on the surface of the plate and protected from damage. FIG. 5 shows a different construction of the storage medium exhibiting the taps in an inner zone of the square storage medium with the labels and/or characterizations on the outer edge. In FIG. 5, the designations "Wiener Blut", "Tango", "Slow-Fox", and "Blues" are indicated by way of example. This arrangement obviously has the advantage that there is less danger of damage to the taps since they are better protected in an inner zone. Also the labeling or characterization is better recognizable in some cases when the storage medium has been inserted in the holder.

Figure 6:
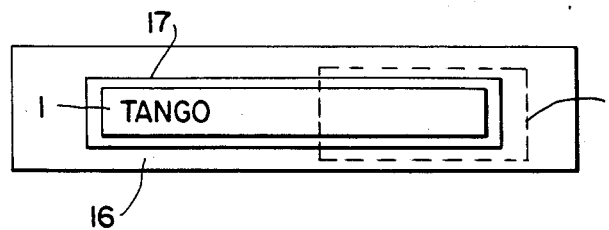
FIG. 6 illustrates the square plate storage medium inserted into a holder with a characterization label visible, and another, inverted characterization label covered with view via a hinged plate.

FIG. 6 shows a different version of the labeling of a storage medium, namely on the narrow side of the square edge. The storage medium 1 is inserted in a slot 17 of the holder 16 so that the narrow side with its labeling, for example "Tango", is readily readable. In this construction, one of the eight labels is, of course, visible, but is inverted, since there are only four edges with respectively two labels. The labels in FIG. 5 as well as in FIG. 6 merely represent exemplary arrangements which are in no way to be considered as limiting. In FIG. 6, a resilient hinged flap 19 is indicated in dashed lines, permitting a mechanical locking of the inserted storage medium in the holder and simultaneously covering the undesirably visible label which is inverted. Also this embodiment of a locking means in the form of a hinged flap 19 is only to be considered as an example, among other numerous possibilities.

Referring once again to FIG. 3, there is illustrated schematically how a storage medium, already provided with information, can be protected from unintentional erasure. In such a case, for example, the corner 20 of the storage medium 1 is broken out, and the contact 21 remains open even if the storage medium has been inserted in the housing 5. As long as the edge 20 has not been broken away, the storage medium 1 actuates the contact 21 during insertion and releases the stored information. Alternatively, erasure of the information can be prevented by a mechanical contact located within the holder fitting for interrupting the supply of erasing currents when one edge of the plate comes into contact therewith.

Another method for preventing the unintended erasing of data is shown schematically in FIG. 1. The bridges 22 each lead to the terminals 23 and thus establish the actual connection to the storage units. If, now, one of the uncovered connecting lines or bridges 22 is interrupted, for example by being scraped off, then a further introduction of data for storage is prevented. An auxiliary contact, such as contact 21 shown in FIG. 3, can also be associated with an auxiliary function, in such a way that when the storage medium has been inserted, i.e. when the contact 21 is closed, the total installation or entire unit is turned on by way of this contact.

In the foregoing description, the recording and reproduction of digitally stored language or music have been disclosed as practical examples. The storage medium of this invention is, of course, also excellently suitable for dictating devices, test processing, television presentations, as well as for all utilizations wherein it is important to have available for direct access certain data or groups of data in a clearly charcterized and labeled form.

The application of this invention is not limited, either, to language and music, but is perfectly suitable for the storage of pictorial information. The limits of usability are only set by the storage capacity to be accommodated on a certain plate size.

The invention being thus described, it will be obvious that the same way be varied in many ways. Such variations are not to be regarded as a departure from the spirit and scope of the invention, and all such modifications as will be obvious to one skilled in the art are intended to be included within the scope of the following claims.

I claim:

1. A storage medium for an electronic recording and readout apparatus which comprises:
   a data recording medium comprising first and second surfaces having a plurality of edges, said medium containing therein a multitude of storage elements corresponding to each of said respective edges of said medium for storing memory content in said data recording medium for use in recording and read-out of digital information; and
   a plurality of taps arranged at each respective edge of said data recording medium which input information for recording, at least one of said taps initiating read-out from said storage elements in a cyclic-series fashion, said recording medium being divided into a plurality of storage sections and comprising said storage elements corresponding to each edge of said recording medium for storing said memory content, each of said storage sections being separately accessible via said taps depending upon which edge of said storage medium is inserted into a holder fitting for said electronic record of read-out apparatus,
   whereby said storage medium is insertable in at least four different directions and eight different positions into said record and read-out apparatus such that said storage sections associated with said respective edges of said data recording medium corresponding to said direction and position are recordable or readable.

2. A storage medium in accordance with claim 1, further comprising means for locking said data recording medium into said holder fitting when said recording medium is inserted thereinto.

3. A storage medium in accordance with claim 1, wherein said data recording medium comprises a printed circuit board inclusive of said storage elements, with said tap means being in contact with corresponding storage elements.

4. A storage medium in accordance with claim 1, further including in combination: means associated with said taps for preventing the erasure of said digital information in said storage elements.

5. A storage medium in accordance with claim 4, wherein said means for preventing the erasure of said stored digital information comprises interruptable connecting leads connecting each of said taps with corresponding storage elements such that electrical current supply between one of said taps and a corresponding storage element is interrupted by open-circuiting said respective connecting lead.

6. A storage medium in accordance with claim 4, wherein said means for preventing the erasure of said stored digital information comprises a mechanical contact means located within said holder fitting for interrupting the supply of erasing current when one edge of said plate means comes into contact therewith.

7. A storage medium in accordance with claim 1, further comprising label identifying means present at the outer edges of said data recording medium for identifying digital information stored therein.

8. A storage medium in accordance with claim 1, wherein said taps are arranged juxtapositioned to said respective edges around an inner zone on at least one of said surfaces of said data recording medium and further including label identifying means arranged around said taps on said respective surface.

9. A storage medium in accordance with claim 1, wherein said data recording medium is flexible and has a relatively small thickness dimension.

10. A storage medium in accordance with claim 1, wherein said data recording medium is square in shape.

11. The storage medium of claim 10, which comprises at least four memory content storage sections, each of which corresponds respectively to an edge of said data recording medium with the related taps being accessible depending upon which edge of said storage medium is inserted into said holder fitting.

12. The storage medium of claim 10, comprising eight memory content storage sections, two corresponding to each edge of said data recording medium in association with the respective surfaces thereof, with the related taps being accessible depending upon which surface and edge of said storage medium is inserted into said holder fitting.

* * * * *